United States Patent
Kho et al.

(10) Patent No.: US 9,490,787 B1
(45) Date of Patent: Nov. 8, 2016

(54) SYSTEM AND METHOD FOR INTEGRATED CIRCUIT CLOCK DISTRIBUTION

(71) Applicant: Infineon Technologies AG, Neubiberg (DE)

(72) Inventors: Rex Kho, Holzkirchen (DE); Andreas Weisgerber, Munich (DE); Dirk Hesidenz, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/737,224

(22) Filed: Jun. 11, 2015

(51) Int. Cl.
| | | |
|---|---|---|
| H04L 7/00 | (2006.01) |
| H03K 5/135 | (2006.01) |
| H03L 7/081 | (2006.01) |
| H03L 7/091 | (2006.01) |
| H03K 5/00 | (2006.01) |

(52) U.S. Cl.
CPC ............. *H03K 5/135* (2013.01); *H03L 7/0812* (2013.01); *H03L 7/091* (2013.01); *H03K 2005/00019* (2013.01)

(58) Field of Classification Search
USPC .......................... 375/354; 713/401, 500, 600
See application file for complete search history.

(56) References Cited

U.S. PATENT DOCUMENTS

| | | | |
|---|---|---|---|
| 6,260,175 B1 | 7/2001 | Basel | |
| 6,429,715 B1 | 8/2002 | Bapat et al. | |
| 6,851,069 B1 | 2/2005 | Ahmad et al. | |
| 7,375,561 B2 | 5/2008 | Kuo et al. | |
| 7,382,844 B2* | 6/2008 | Hwang | G06F 1/10 327/141 |
| 7,581,131 B1* | 8/2009 | Prasad | G06F 1/12 713/400 |
| 7,859,309 B2* | 12/2010 | Lo | G06F 1/10 326/93 |
| 7,870,413 B2* | 1/2011 | Jong | G06F 1/12 713/500 |
| 8,295,419 B2* | 10/2012 | Hwang | G06F 1/10 375/354 |
| 8,321,719 B2* | 11/2012 | Schaefer | G11C 7/1066 710/58 |
| 2006/0061401 A1* | 3/2006 | Shiratake | G06F 1/10 327/291 |
| 2015/0243595 A1* | 8/2015 | Liu | H01L 23/49838 257/659 |

FOREIGN PATENT DOCUMENTS

| | | |
|---|---|---|
| DE | 102010046119 A1 | 4/2011 |
| WO | 2009024761 A2 | 2/2009 |

* cited by examiner

*Primary Examiner* — Adam Houston
(74) *Attorney, Agent, or Firm* — Slater Matsil, LLP

(57) ABSTRACT

An embodiment integrated circuit (IC) clock distributor system includes a first IC. The first IC includes a clock synchronizer circuit and a clock generator circuit. The clock synchronizer circuit includes a first input coupled to a first clock transfer path including a replica delay of a portion of a first signal path included in an external IC. The clock synchronizer circuit also includes a second input coupled to a second clock transfer path. The clock generator circuit also includes an input coupled to an output of at least one of a reference oscillator and the clock synchronizer circuit. Delay of the second clock transfer path includes delay of the first signal path.

27 Claims, 10 Drawing Sheets

SYSTEM AND METHOD FOR INTEGRATED CIRCUIT CLOCK DISTRIBUTION

TECHNICAL FIELD

The present invention relates generally to a system and method for clock distribution, and, in particular embodiments, to a system and method for Integrated Circuit (IC) clock distribution.

BACKGROUND

Interfaces between multiple ICs of a single system are useful for a variety of applications. These applications include computer interfaces between CPU and Dynamic Random-Access Memory (DRAM) (including Double Data Rate Synchronous DRAM (DDR SDRAM), DDR2 SDRAM, DDR3 SDRAM protocols), Systems-in-Package (SiPs), and other IC-to-IC interfaces.

Nevertheless, synchronizing such multiple IC systems presents a number of challenges. On a large IC, a clock tree may be used to ensure that a clock signal propagates throughout the chip in a manner that controls the timing skew of clock signals as they reach various clocked components, such as registers. Such clock trees are often balanced separately for each IC in a multiple IC system. After balancing, each clock tree may include an independently derived number of buffers providing an independently designed amount of delay. Circuits within each IC's input and output paths may also cause timing delay, and these circuits may include Electro-Static Discharge (ESD) protection circuits, voltage level shifters, input drivers, and output drivers. The delays of these input and output path circuits and the delays of each of the clock tree buffers may vary with independently varying Process, Voltage, and Temperature (PVT) variations of each IC. The delays of the clock tree buffers balance timing skew of clock signals delivered to clocked features of each respective IC. However, balancing clock skew on an individual chip level may not guarantee low clock skew over the multiple ICs in a multiple IC system.

SUMMARY OF THE INVENTION

An embodiment method for integrated circuit (IC) clock distribution is provided. The method includes receiving a clock signal from a first IC over a first clock transfer path. The first clock transfer path includes a replica delay of a portion of a second clock transfer path. The method also includes generating, by a second IC, a clock signal of the second IC, transmitting the second IC clock signal over the second clock transfer path, receiving the second IC clock signal from the second clock transfer path, and determining, by the second IC, a clock root signal in accordance with the received first IC clock signal and the received second IC clock signal.

An embodiment IC clock distribution circuit is also provided. The circuit is configured to receive a clock signal from a first IC over a first clock transfer path. The first clock transfer path includes a replica delay of a portion of a second clock transfer path. The circuit is also configured to generate, by a second IC, a clock signal of the second IC, transmit the second IC clock signal over the second clock transfer path, receive the second IC clock signal from the second clock transfer path, and determine, by the second IC, a clock root signal in accordance with the received first IC clock signal and the received second IC clock signal.

An embodiment integrated circuit clock distributor system is also provided. The IC clock distributor system includes a first IC. The first IC includes a clock synchronizer circuit and a clock generator circuit. The clock synchronizer circuit includes a first input coupled to a first clock transfer path including a replica delay of a portion of a first signal path included in an external IC. The clock synchronizer circuit also includes a second input coupled to a second clock transfer path. The clock generator circuit also includes an input coupled to an output of at least one of a reference oscillator and the clock synchronizer circuit. Delay of the second clock transfer path includes delay of the first signal path.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for distributing a clock signal to two ICs. Further embodiments may be applied to other clock distribution systems that share a clock signal to more than two ICs.

In an embodiment, data is sent and received bi-directionally between a first IC and a second IC, and this data is clocked by clock signals generated by clock trees of the first IC and the second IC. A clock synchronizer circuit and clock transfer paths between the two ICs are used to minimize both timing skew and differences in data clocking periods between the first IC clock signal and the second IC clock signal. The clock transfer paths add delays in the interfaces for input or output from either IC, as well as inter-chip delays from, for example, connecting bonds in the inter-chip boundary. The clock synchronizer circuit, which is located in the second IC and may be, for example, a PLL or a DLL, compensates for the delays of the clock transfer paths and for delays of the clock trees.

The first IC has a clock generation circuit that outputs a first clock signal, which is transferred across the inter-chip boundary for use as an input to the clock synchronizer. A clock generation circuit of the second IC generates a second clock signal that is provided to another clock transfer path, which is a looping path that crosses the inter-chip boundary once and then crosses back over the inter-chip boundary a second time to provide another input of the clock synchronizer. The clock synchronizer generates a clock root signal that is the root of clock tree synthesis and that is provided as an input to the clock generation circuit of one of the ICs.

Figure 1A:
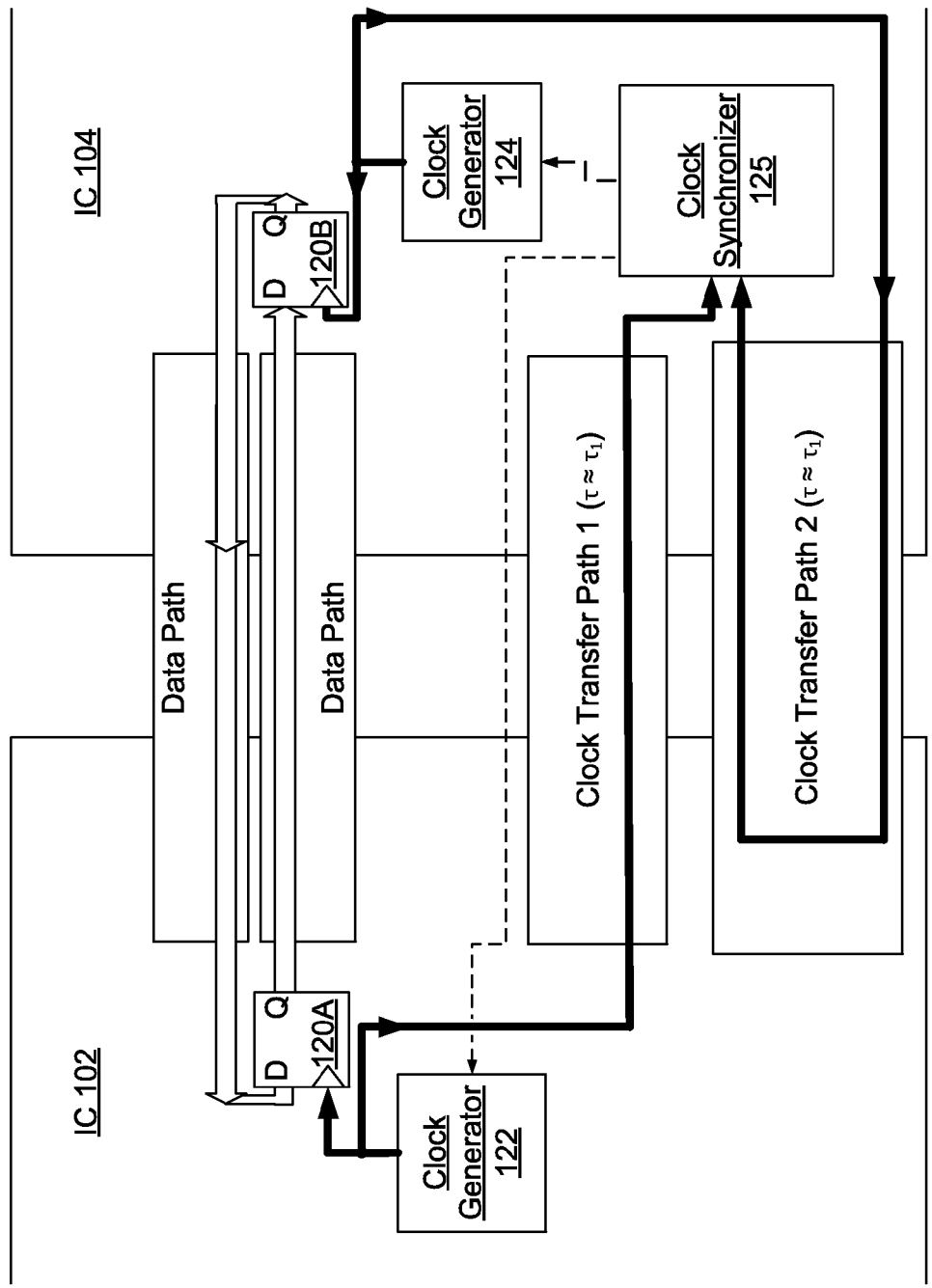
FIG. 1A shows a block diagram of a multiple IC system that has two ICs interconnected to share data and clock signals in accordance with embodiments of the present invention.

FIG. 1A shows an embodiment multiple IC system that has two ICs 102 and 104 interconnected to share data and clock signals. IC 102 includes a Clock Generator circuit 122 and IC 104 includes a Clock Generator circuit 126. IC 102 also includes a data register 120A, and IC 104 includes a data register 120B.

In the embodiment of FIG. 1A, each of register 120A and register 120B has a respective clock input (>), data input (D), and data output (Q) that provide data input and output signals made up of data sequences that are clocked by the respective clock inputs of the registers. Registers 120A and 120B are representative of one or more clocked circuits that are disposed on IC 102 and IC 104, respectively. In IC 102, Clock Generator 122 generates a first clock signal and provides this first clock signal to the clock input of register 120A. In IC 104, Clock Generator 124 generates a second clock signal and provides this second clock signal to the clock input of register 120B. The timing of each of the output signals of Clock Generator 122 and Clock Generator 124 varies with a respective clock generator input that may be an output of, for example, a reference oscillator or the Clock Synchronizer 125. The timing of the Clock Generator 122 output signal also varies with PVT-variable delay that is internal to Clock Generator 122, and the timing of the Clock Generator 124 output signal also varies with PVT-variable delay that is internal to Clock Generator 124.

An initial setup for adjusting one or both of the output timings of Clock Generator 122 and Clock Generator 124 occurs, for example, during start-up of IC 102 and IC 104. After this initial setup, register 120A is "clocked," i.e., triggered to send its data output signals and/or receive its data input signals, at a data clocking time in accordance with a data clocking period of Clock Generator 122. Register 120B is similarly clocked in accordance with a data clocking period of Clock Generator 124, and during the initial setup the relative timing of the output signals of Clock Generator 122 and Clock Generator 124 is compensated to minimize any difference between their data clocking periods.

In some embodiments, the data clocking period of a clock signal is a timing difference between a period starting edge and a period ending edge of the clock signal, as detected at the clock input of Register 120A or Register 120B. In some embodiments that use N-cycle data clocking (where N is an integer greater than or equal to one), the period starting edge is a rising edge or falling edge, the period ending edge is the same kind of edge as the period starting edge, and in particular the period ending edge is the Nth same kind of edge that arrives at a data register after the period starting edge. In other N-cycle data clocking embodiments, the period starting edge is a rising edge or falling edge, the period ending edge is the opposite kind of edge of the period starting edge (where a falling edge is the opposite of a rising edge, and vice versa), and in particular the period ending edge is the Nth opposite kind of edge that arrives at a data register after the period starting edge. For example, in some single-cycle clocking embodiments, the period starting edge and the period ending edge are consecutive rising edges, consecutive falling edges, respectively a rising edge and the immediately following falling edge, or respectively a falling edge and the immediately following rising edge.

Referring again to FIG. 1A, the data output signal from the Q output of register 120B is sent to the data input of register 120A through a first data path, and the data output signal from register 120A is sent to the data input of register 120B through a second data path. Each of these data paths introduce delays in the data from, for example, I/O pads, ESD protection circuits, I/O buffers, level shifters, input drivers, and inter-chip delays. The respective delay introduced to either data path from IC 102 may vary with varying temperature and voltage independently from the delay introduced to either data path from IC 104.

A Clock Synchronizer circuit 125 receives the first clock signal from the Clock Generator 122 and the second clock signal from the Clock Generator 124. The first clock signal is transferred from Clock Generator 122 across a first clock transfer path that crosses the inter-chip boundary before being received at an input to the Clock Synchronizer 125. The second clock signal is provided by Clock Generator 124 to a second clock transfer path, which is a looping path that crosses the inter-chip boundary once and then crosses back over the inter-chip boundary a second time to provide another input of the Clock Synchronizer 125. The first clock transfer path and the looping clock transfer path each add delay ($\tau$) to respective clock signals that are transmitted over them. In the embodiment of FIG. 1A, at least a portion of the delay of the looping clock transfer path is replicated as a delay $\tau_1$ in the first clock transfer path. This replica delay in the two clock transfer paths may be provided by, for example, identical circuits that are included in each of the two clock transfer paths, or circuits that are not identical but that have approximately the same delay.

The Clock Synchronizer 125 compares the delayed version of the first clock signal and the delayed version of the second clock signal to determine a clock root signal. The Clock Synchronizer 125 provides this clock root signal to one of Clock Generator 122 or Clock Generator 124, so that the clock input timings of one or both of the registers 120A and 120B may be thereby adjusted to compensate for the delays that are added by Clock Generator 122, Clock Generator 124, and for any difference in delay of the two clock transfer paths. In some embodiments, the Clock Synchronizer 125 provides the clock root signal to Clock Generator 124, the looping clock transfer path is a clock closure path, and the output signal of Clock Generator 122 has a timing derived from a reference clock signal. In other embodiments, the Clock Synchronizer 124 provides the clock root signal to Clock Generator 122, the clock transfer path from Clock Generator 122 to Clock Synchronizer 125 is a clock closure path, and the output signal of Clock Generator 124 has a timing derived from a reference clock signal.

Figure 1B:
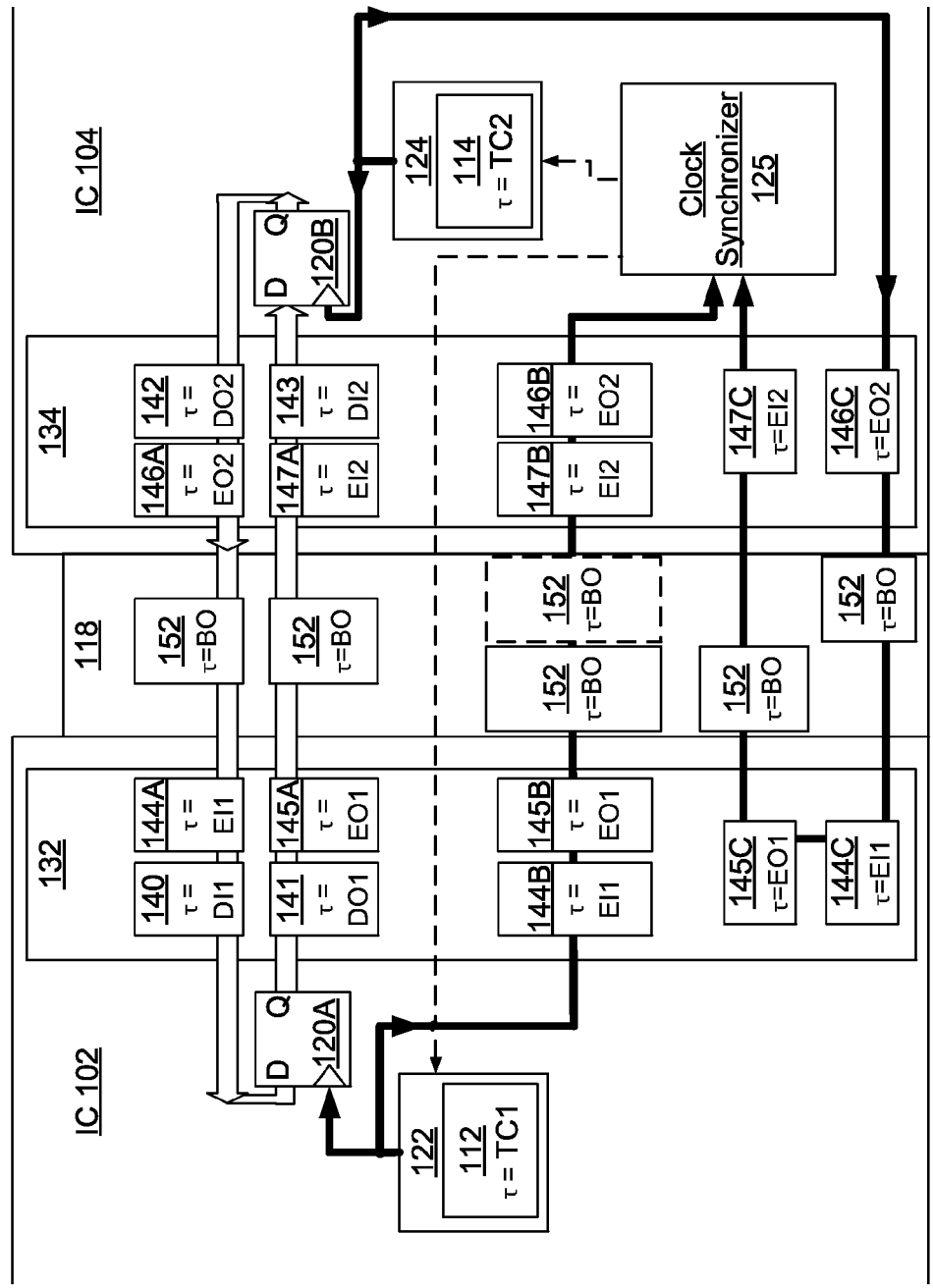
FIG. 1B shows a block diagram of a two IC system that includes Input/Output (I/O) sections and an inter-chip section that each add delay to the data signals, in accordance with embodiments of the present invention.

FIG. 1B shows an embodiment multiple IC system that includes a first I/O section 132 of IC 102 and a second I/O section 134 of IC 104, each of which includes various IC interface circuitry such as I/O pads, ESD protection circuits, I/O buffers and level shifters.

Referring to FIG. 1B, Clock Generator 122 includes a clock tree 112 that includes internal delay that varies with PVT variations of IC 102. Clock Generator 124 similarly includes a clock tree 114 that includes internal delay that varies with PVT variations of IC 104. The clock transfer path that crosses the inter-chip section 118 between Clock Generator 122 and Clock Synchronizer 125 includes a input interface circuit 144B of I/O section 132 and an output interface circuit 145B of I/O section 132. The clock transfer path between Clock Generator 122 and Clock Synchronizer 125 also includes an input interface circuit 147B of I/O section 134 and an output interface circuit 146B of I/O section 134. The looping clock transfer path includes a first signal path that includes an input interface circuit 147C of I/O section 134, a second signal path that includes an output interface circuit 146C of I/O section 134, a third signal path that includes the input interface circuit 144C of I/O section 132, a fourth signal path that includes the output interface circuit 145C of I/O section 132, and two inter-chip delay paths 152 in the inter-chip section 118. In order of signal flow, the looping clock transfer path sends a clock signal through the output interface circuit 146C of I/O section 134, a first inter-chip delay path 152 of the inter-chip section 118, the input interface circuit 144C of I/O section 132, the output interface circuit 145C of I/O section 132, a second inter-chip delay path 152, and then the input interface circuit 147C of I/O section 134.

The data output signal from the Q output of register 120B is sent to the data input of register 120A through I/O section 134 for output from IC 104, then through a third inter-chip delay path 152 of the inter-chip section 118 connecting ICs 104 and 102, and then through I/O section 132 for input to IC 102. Each of I/O section 134 and I/O section 132 introduce delay in the data output signal from register 120B. Similarly, the data output signal from register 120A is sent to the data input of register 120B through I/O section 132 for output from IC 102, through a fourth inter-chip delay path 152 of the inter-chip section 118, and then through I/O section 134 for input to IC 104, each of which introduce a delay in the data output signal from register 120A. The inter-chip delay paths can include, for example, one or more bonds connecting ICs 102 and 104, such as bond wires, Through Silicon Vias (TSVs), flip-chip connections, etc. In some embodiments, the clock transfer path between Clock Generator 122 and Clock Synchronizer 125 also includes one or more inter-chip delay paths 152 of the inter-chip section 118 connecting IC 102 and 104.

I/O section 132 includes an input data sub-section 140 for data that is input to IC 102, and an output data sub-section 141 for data to be output from IC 102. I/O section 134 similarly includes a input data sub-section 143 and an output data sub-section 142 for input and output data for IC 104. Each of data sub-sections 140, 141, 142, and 143 is a data path that adds respective delay to data passing through it and may include buffers and/or combinatorial logic.

I/O section 132 also includes an input interface circuit 144A for input data to IC 102. I/O section 132 also includes an output interface circuit 145A for output data from IC 102. Data that is input to IC 102 passes through the input interface circuit 144A, and data that is output from IC 102 passes through the output interface circuit 145A. I/O section 134 similarly includes an input interface circuit 147A through which input data passes and an output interface circuit 146A through which output data passes.

Each of input interface circuits 144A-144C and 147A-147C of the data paths, the clock transfer path between Clock Generator 122 and Clock Synchronizer 125, and the looping clock transfer path may include ESD protection devices, input level shifters, input drivers, input pads, etc. Each of output interface circuits 145A-145C and 146A-146C may include ESD protection devices, output level shifters, output drivers, output pads, etc. The voltages across each of input interface circuits 144A-144C and 147A-147C and output interface circuits 145A-145C and 146A-146C may be respective variable voltages such that an input interface circuit and an output interface circuit may be placed in series with each other in either an input path or an output path. In some embodiments, the variable voltages of such a pair of interface circuits may be adjusted to provide a combined voltage that is either an input voltage or an output voltage.

Each of the foregoing clock trees, input interface circuits, input data sub-sections, output interface circuits, output data sub-sections, and inter-chip delay paths of IC 102 and IC 104 adds a respective PVT-variable delay to a signal passing through it.

In this disclosure the delay added by the components of IC 102 and IC 104 will be referred to by the following nomenclature: Clock tree 112 adds a delay of TC1, clock tree 114 adds a delay of TC2, input interface circuits 144A-144C add a delay of EI1, input data sub-section 140 adds a delay of DI1, output interface circuits 145A-145C add a delay of EO1, output data sub-section 141 adds a delay of DO1, input interface circuits 147A-147C add a delay of EI2, input data sub-section 143 adds a delay of DI2, output interface circuits 146A-146C add a delay of EO2, and output data sub-section 142 adds a delay of DO2.

Inter-chip delay paths 152 in the inter-chip boundary also add a delay to data or other signals passing in either direction between IC 102 and IC 104. In the embodiment of FIG. 1B, each such inter-chip delay path 152 has delay BO that is a replica delay of every other inter-chip delay path 152. In some embodiments, this inter-chip delay BO may be, for example, less than 5 picoseconds. In some embodiments, multiple instances of the same inter-chip delay 152, for example, multiple connecting bonds, or a connecting bond and a buffer with a replica delay of the connecting bond, may be connected in series in the same signal path between IC 102 and IC 104. Such multiple inter-chip delays 152 add a delay to the signal that is a multiple of BO.

In the embodiment of FIG. 1B, the clock transfer path between Clock Generator 122 and Clock Synchronizer 125 and the looping clock transfer path are physically distinct from the data paths between register 120A and register 120B, but input interface circuits 144A-144C all replicate each other's delay. Similarly, output interface circuits 145A-145C all replicate each other's delay; output interface circuits 146A-146C all replicate each other's delay; and input interface circuits 147A-147C all replicate each other's delay. In some embodiments, input interface circuits 144A-144C may be identical circuits, input interface circuits 147A-147C may be identical circuits, output interface circuits 145A-

145C may be identical circuits, and output interface circuits 146A-146C may be identical circuits. In other embodiments, delays added by input or output interface circuits within the data paths do not replicate delays added by input or output interface circuits within the two clock transfer paths.

In the embodiment of FIG. 1B, input interface circuit 144B and output interface circuit 146B, which are circuits that are respectively identical to input interface circuit 144C and output interface circuit 146C, are included within the clock transfer path between Clock Generator 122 and Clock Synchronizer 125 so that the total delay of this clock transfer path will more closely replicate delay of the looping clock transfer path. In other embodiments, input interface circuit 144B is not an identical circuit of input interface circuit 144C of the looping clock transfer path, but instead includes a combination of one or more buffers that replicates the delay of the input interface circuit 144C; and output interface circuit 146B is not an identical circuit of output interface circuit 146C of the clock transfer path between Clock Generator 122 and Clock Synchronizer 125, but instead includes a combination of one or more buffers that replicates the delay of the output interface circuit 146C of the looping clock transfer path.

Figure 1C:
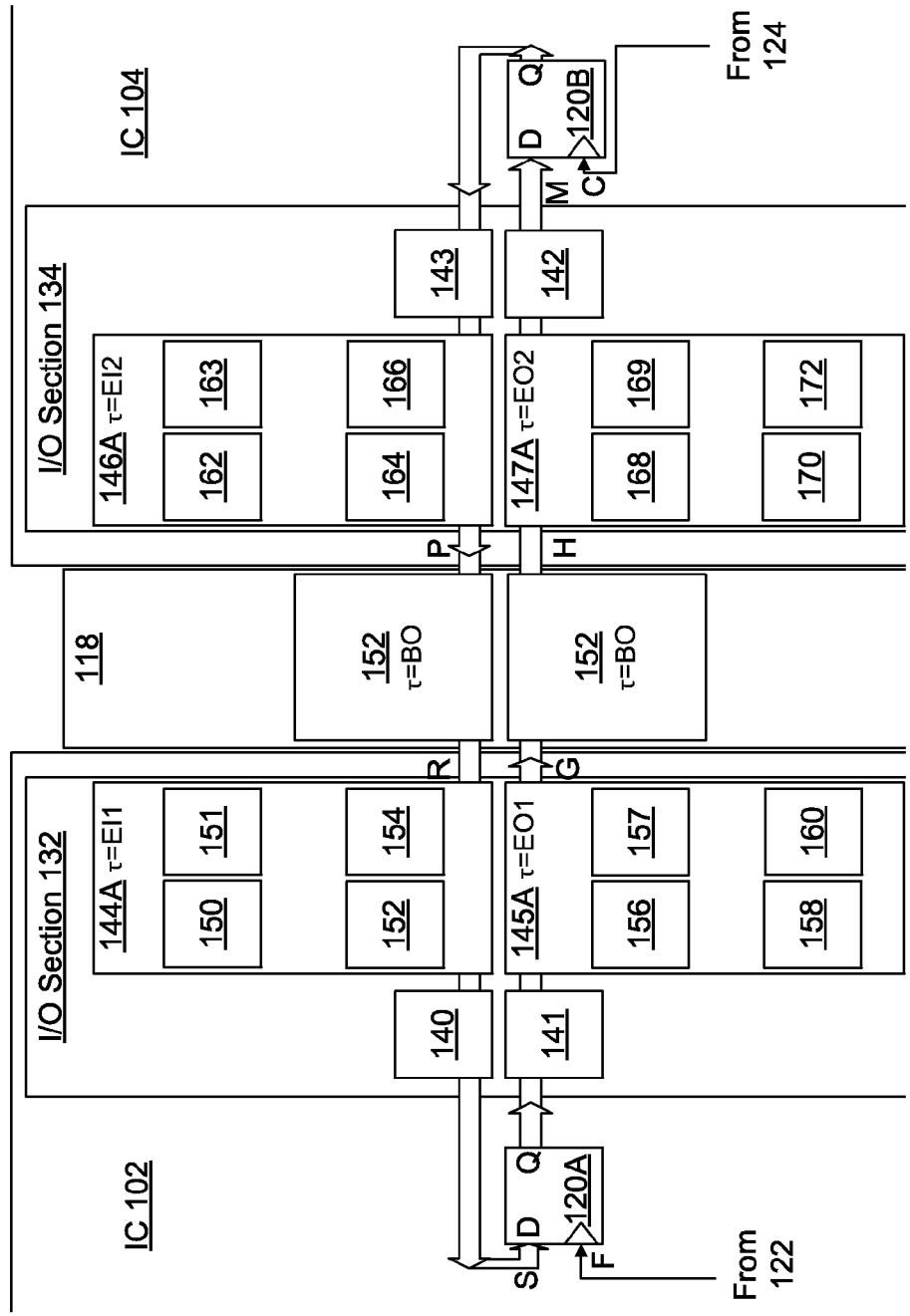
FIG. 1C shows a block diagram providing further detail for the data path of a two IC system.

Referring now to FIG. 1C, a block diagram provides further detail of embodiments data paths of a two-IC system. Input interface circuit 144A of IC 102 includes an input pad 150, an input ESD protection circuit 151, an input buffer 152, and an input level shifter 154, which may shift, for example, a voltage level of input data, a current level of the input data, or both. Similarly, input interface circuit 146A of IC 104 includes an input pad 168, an input ESD protection circuit 169, an input buffer 170, and an input level shifter 172. Output interface circuit 145A of IC 102 includes an output level shifter 156, an output buffer 157, an output ESD protection circuit 158, and an output pad 160. The output level shifter 156 may shift, for example, a voltage level of output data, a current level of the output data, or both. Similarly, output interface circuit 147A of IC 104 includes an output level shifter 162, an output buffer 163, an output ESD protection circuit 164, and an output pad 166.

Various points in the two-IC system have different timings relative to each other. In this disclosure, the following nomenclature will be used to refer to the timing of various points in the two IC system:

a. A first clock signal output from clock tree 112 of IC 102 reaches the clock input of register 120A at a signal timing F.
b. A second clock signal output from clock tree 114 of IC 104 reaches the clock input of register 120B at a signal timing C.
c. IC 102 output data sent from the Q output of register 120A reaches the output of I/O section 132 at a signal timing G.
d. IC 104 input data reaches the input to I/O section 134 at a signal timing H.
e. IC 104 input data reaches the D input to register 120B at a signal timing M.
f. IC 104 output data sent from the Q output of register 120B reaches the output of I/O section 134 at a signal timing P.
g. IC 102 input data reaches the input to I/O section 132 at a signal timing R.
h. IC 102 input data reaches the D input to register 120A at a signal timing S.

If certain requirements are met, the clock input timing of data register 120A (i.e., the output timing from clock tree 112) or the clock input timing of data register 120B (i.e., the output timing from clock tree 114) may be adjusted to compensate for PVT-variable delay that is added by clock tree 112, clock tree 114, I/O section 132, the inter-chip delay paths 152, and I/O section 134 to the clock transfer path between Clock Generator 122 and Clock Synchronizer 125. In particular, data should arrive at data register 120A or data register 120B in advance of a signal timing for clocking the data into data register 120A or data register 120B. In this disclosure, the difference in the data arrival time and the data clocking timing is referred to as "data margin." If N-cycle data clocking is used in IC 102 and IC 104, these requirements for appropriately compensating for the data path delay are set forth in the following inequality in terms of the N-cycle data clocking period (N×T) used to clock a single data bit or other single data unit in an arbitrary direction between the data registers 120A and 120B:

$$G-F+M-H+BO<N\times T>P-C+S-R+BO. \qquad (1)$$

In some embodiments, the relative timing of the outputs of clock tree 112 and/or clock tree 114 may be compensated such that any timing skew or period difference between timing F at the clock input of register 120A of IC 102 and timing C at the clock input of register 120B of IC 104 is reduced. Any uncompensated timing skew adds or removes a portion of the data margin, depending on the direction of data transmission.

Figure 2A:
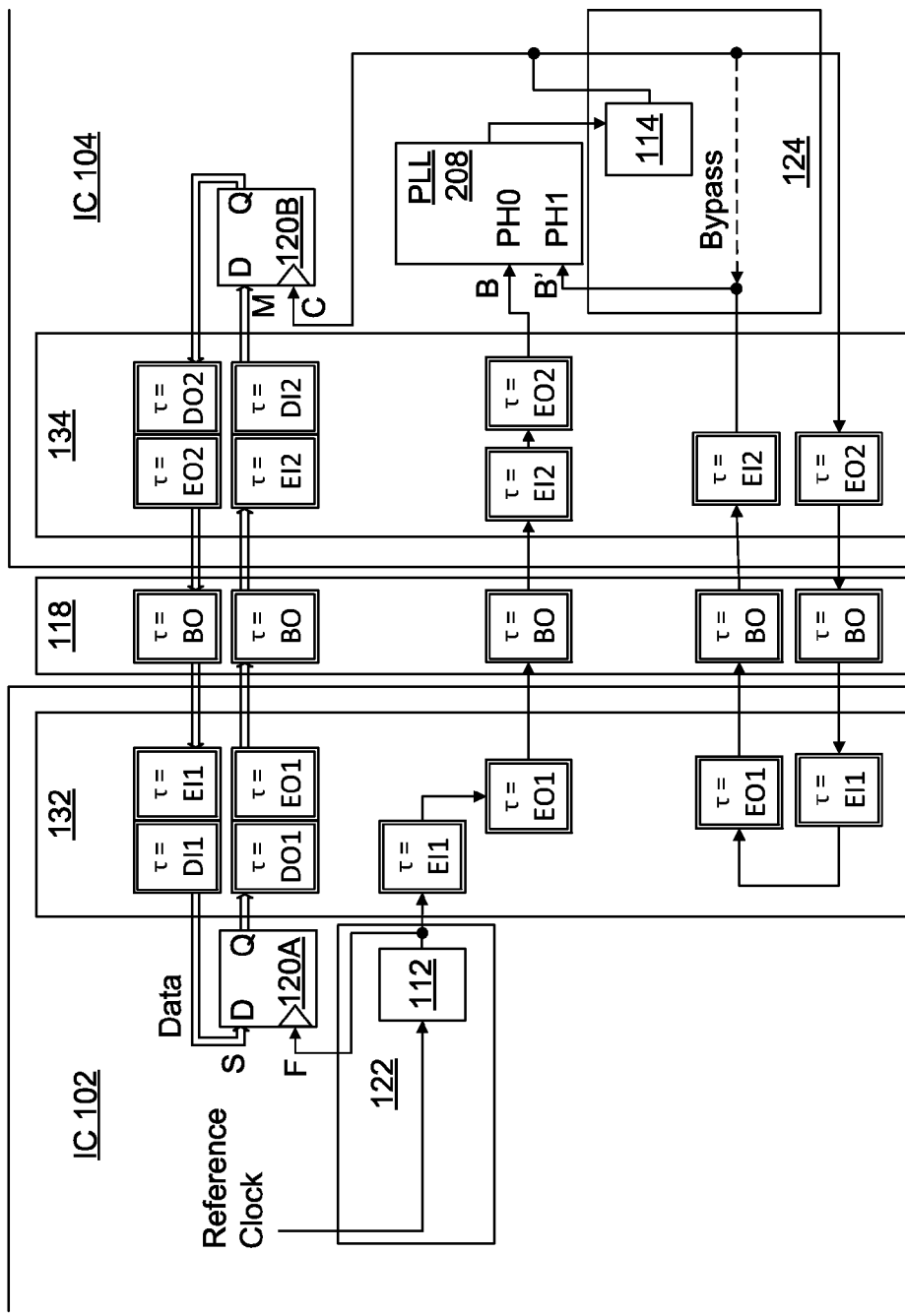
FIG. 2A shows a block diagram of a two IC system in which a Phase Lock Loop (PLL) reduces the timing difference of data registers, in accordance with embodiments of the present invention.

Referring now to FIG. 2A, an embodiment two IC system is shown in which the Clock Generator 124 of IC 104 uses a PLL 208 as the clock synchronizer 125. In this embodiment, a reference clock signal is provided to the Clock Generator 122 of IC 102. This reference clock signal may be provided by, for example, a crystal oscillator or other stable electronic oscillator, which may either be located in IC 102 or may be external to IC 102.

In the embodiment of FIG. 2A, clock tree 112 provides a first clock signal to a PH0 phase input of PLL 208 after this first clock signal passes through I/O section 132, through interface 118, and then through I/O section 134, each of which introduce delay into the first clock signal. I/O section 132 introduces a delay of EI1 and another delay of EO1 into the clock signal output from clock tree 112 by respectively sending it through the input interface circuit 144B and output interface circuit 145B (both shown in FIG. 1B) of I/O section 132. In the embodiment of FIG. 2A, inter-chip section 118 then adds a single delay of BO to the clock signal output of clock tree 112 by sending the signal through an inter-chip delay path 152 (shown in FIG. 1B).

I/O section 134 then introduces a delay of EI2 and EO2 into the clock signal output of clock tree 112 by routing it through the input interface circuit 147B and output interface circuit 146B of I/O section 134, respectively (both shown in FIG. 1B). In the embodiment of FIG. 2A, when the first clock signal reaches the PH0 input of PLL 208, it has a signal timing B, which is related to F by the following equation:

$$F=B-EI1-EO1-BO-EI2-EO2. \qquad (2)$$

PLL 208 also receives the clock signal generated by clock tree 114 of IC 104 at a PH1 phase input of the PLL 208, after this clock signal has been delayed by a loop passing through I/O section 134, inter-chip section 118, and I/O section 132. This clock signal is first generated by clock tree 114 based on the output of PLL 208. PLL 208B synchronizes the timings for clocking data between registers 120A and 120B by tracking and compensating for the PVT-variable clock timings of the output of the clock transfer path between Clock Generator 122 and Clock Synchronizer 125 and the output of the looping clock transfer path.

The loop from the output of clock tree 114 is capable of being bypassed when IC 104 is in bypass mode such as, for example, when IC 104 is being individually tested. During bypass mode, the second clock signal is provided by a bypass switch connected directly from the output of clock tree 114 to the PH1 input of PLL 208. When IC 104 is not in bypass mode, the clock signal output from clock tree 114 is delayed by EO2 as it passes through I/O section 134 a first time, then by BO as it passes through inter-chip section 118 a first time, then by EI1 in I/O section 132, then by EO1 in I/O section 132, then by BO as it passes through inter-chip section 118 a second time, then by EI2 as it passes through I/O section 134 a second time, before being fed back to the PH1 input of PLL 208. In the embodiment of FIG. 2A, delays EI2, EO2, EI1 and EO1 are respectively provided in the looping clock transfer path by input interface circuit 147C, output interface circuit 146C, input interface circuit 144C, and output interface circuit 145C (all shown in FIG. 1B). In other embodiments, some or all of these delays are added to the looping clock transfer path by one or more buffers designed to replicate the delay of the clock transfer path between Clock Generator 122 and Clock Synchronizer 125.

In the embodiment of FIG. 2A, inter-chip section 118 also adds a first delay of BO and a second delay of BO to the second clock signal in the looping clock transfer path by sending the signal through a first inter-chip delay path 152 on the path from IC 104 to IC 102 and then through a second inter-chip delay path 152 on the path back to IC 104 from IC 102. Therefore, when the second clock signal reaches PH1 it has a signal timing B', which is related to timing C at the clock input of register 120A of IC 102 by the following equation:

$$C=B'-EI1-EO1-2BO-EI2-EO2. \qquad (3)$$

Because PLL 208 adjusts the timing of its root clock signal output until signal timings B' and B at its inputs are indistinguishable in accordance with a resolution of the PLL 208, from Equations 3 and 4 it can therefore be seen that timing F (at the clock input of register 120A of IC 102) is related to timing C (at the clock input of register 120B of IC 104) by the following equation:

$$C=F-BO. \qquad (4)$$

In the embodiment of FIG. 2A, timing C at the clock input of register 120B of IC 104 is thus advanced relative to timing F at the clock input of register 120A of IC 102 by the delay amount BO of an inter-chip delay path 152 (shown in FIGS. 1B-C).

Figure 2B:
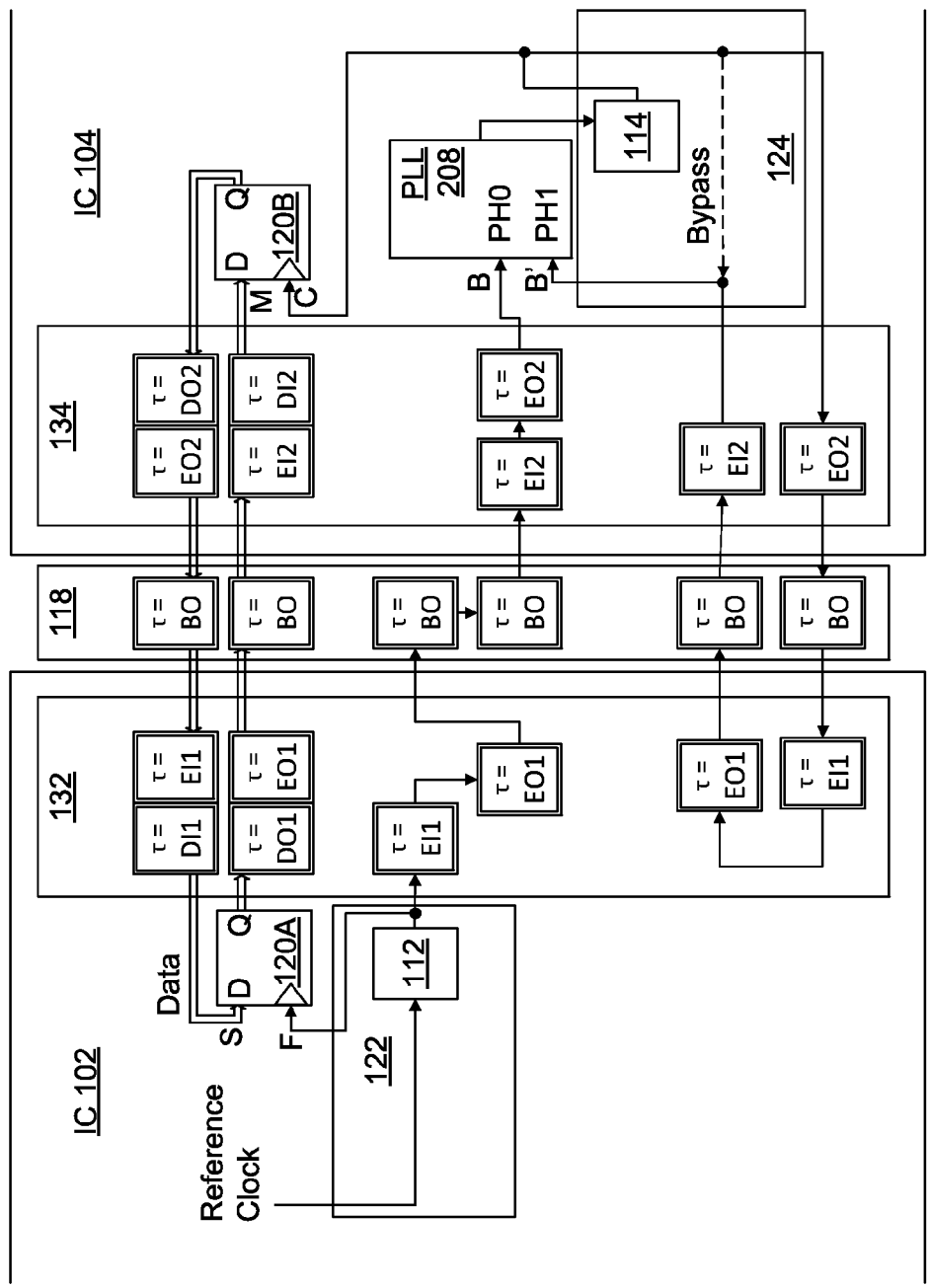
FIG. 2B shows a block diagram of an alternative configuration of the two IC system to further reduce the timing difference between data registers, in accordance with embodiments of the present invention.

FIG. 2B shows an alternative embodiment two IC system is in which IC 104 has a PLL 208 and is configured to adjust the timing C at the clock input of register 120B of IC 104 to further reduce timing skew relative to timing F at the clock input of register 120A of IC 102. This embodiment is identical to the embodiment of FIG. 2A, except that as the first clock signal generated by clock tree 112 is sent to the PH0 input of PLL 208, the delay that is added to this first clock signal by the clock transfer path between Clock Generator 122 and Clock Synchronizer 125 is increased by an amount BO relative to the embodiment of FIG. 2A. In some embodiments, this second delay BO of the clock transfer path between Clock Generator 122 and Clock Synchronizer 125 is added in inter-chip section 118 by sending the signal through a second inter-chip delay path 152 (shown in FIG. 1B) in series with the first inter-chip delay path 152 of inter-chip section 118; these two inter-chip delay paths of this first clock transfer path make up a fifth inter-chip delay path 152 and a sixth inter-chip delay path 152 of the inter-chip section 118, which are in addition to the other four inter-chip delay paths 152 of the looping clock transfer path and the two data paths. In other embodiments, the second delay of BO in the clock transfer path between Clock Generator 122 and Clock Synchronizer 125 is added by one or more buffers designed to replicate the delay of an inter-chip delay path 152.

Figure 2C:
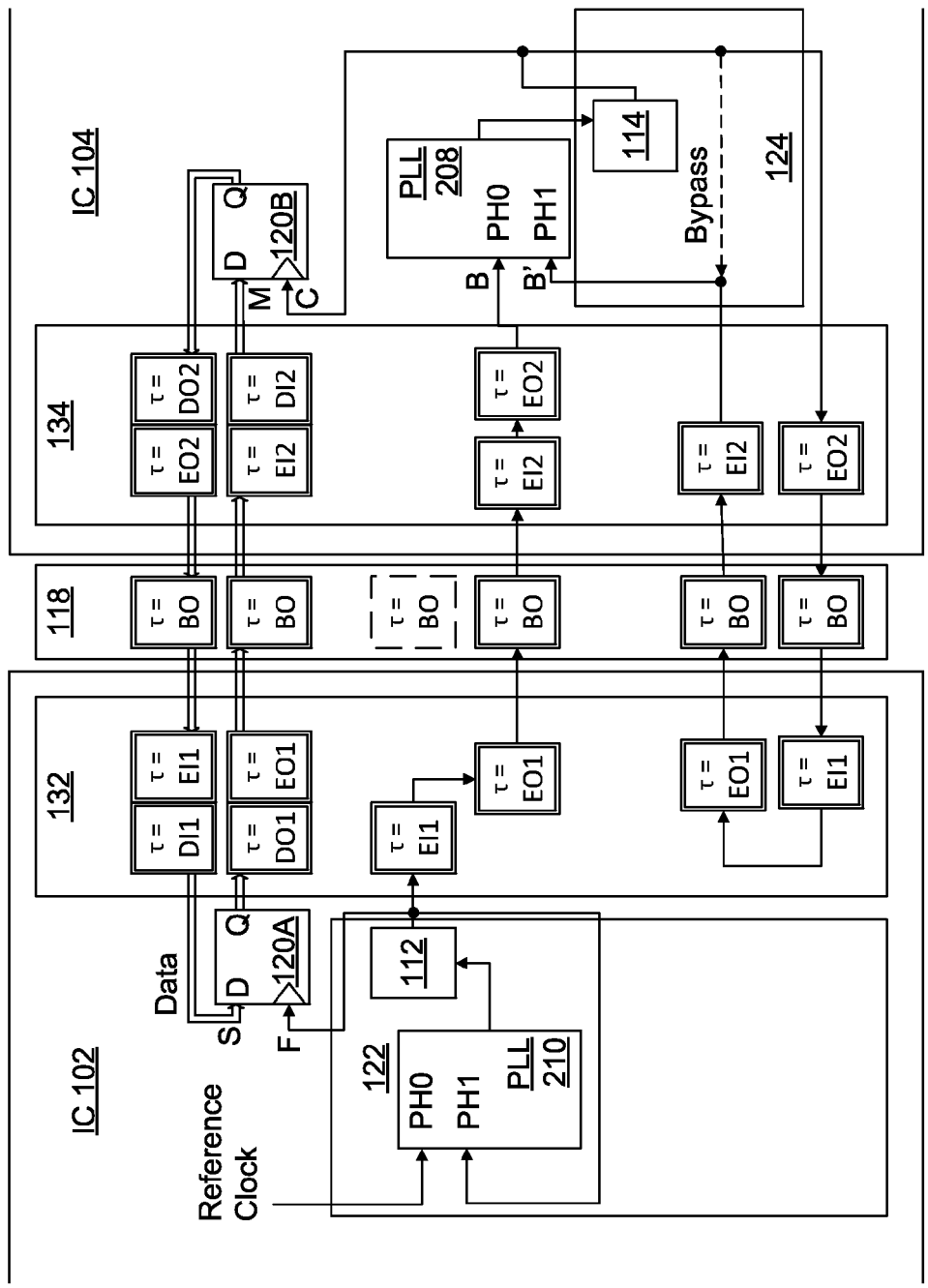
FIG. 2C shows a block diagram of a two IC system in which both ICs have a PLL, in accordance with embodiments of the present invention.

Referring now to FIG. 2C, an embodiment two IC system is shown in which both IC 102 and IC 104 have a PLL. This embodiment is identical to the embodiment of FIG. 2A, except that IC 102 has its own PLL 210, the reference clock signal is provided to a PH0 input of the PLL 210 instead of to clock tree 112, and the clock signal that is output from clock tree 112 is provided to a PH1 phase input of PLL 210 in addition to being provided to I/O section 132.

This PLL 210 delays the clock signal output of clock tree 112 so that it is in phase with the reference clock signal, which reduces the amount of timing compensation that must be performed by PLL 208 of IC 104. Similar to the embodiment of FIG. 2A, the inter-chip section 118 only adds a single delay of BO to the clock signal in the path between the output of clock tree 112 and the PH0 input of PLL 208. In other embodiments that are more similar to the embodiment of FIG. 2B, the inter-chip section 118 adds a delay of 2BO to the clock signal between the output of clock tree 112 and the PH0 input of PLL 208.

Figure 2D:
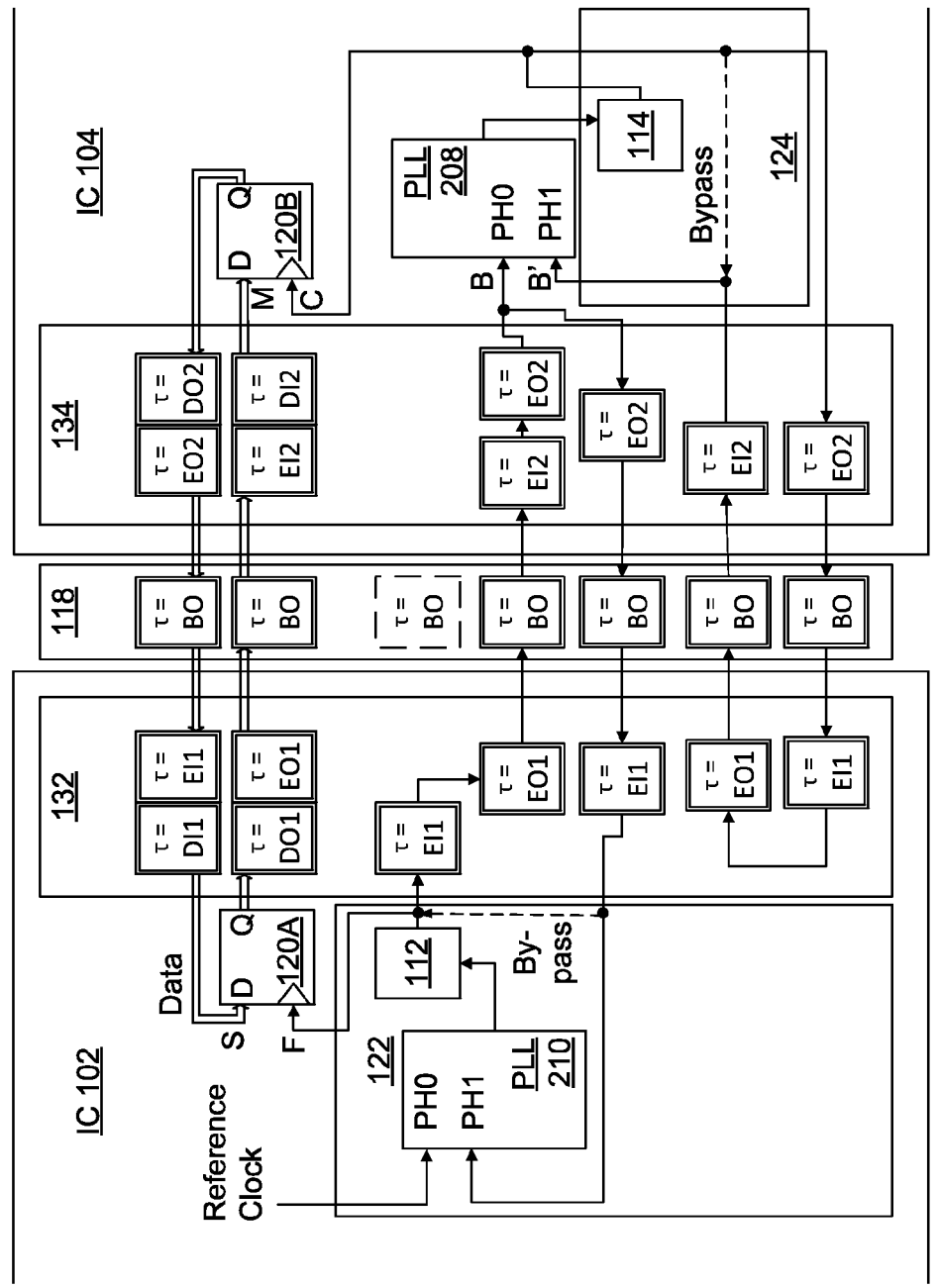
FIG. 2D shows a block diagram of a two IC system in which both PLLs have an output path that traverses the IC-to-IC interface, in accordance with embodiments of the present invention.

Referring now to FIG. 2D, an embodiment two IC system is shown in which both IC 102 and 104 have a PLL, and both PLLs have an output path that traverses the inter-chip section 118. This embodiment is identical to the embodiment of FIG. 2C, except that the clock signal that is output from clock tree 112 is only fed directly back to the PH1 input of PLL 210 when IC 102 is in bypass mode, and otherwise this first clock signal is provided to the PH1 input of PLL 210 by a feedback path coupled to the PH0 input of PLL 208. This first clock signal is tapped at the PH0 input of PLL 208 and is delayed by I/O section 134, inter-chip section 118, and I/O section 132 before reaching the PH1 input of PLL 210. I/O section 134 adds to the first clock signal a delay of EO2 by sending this first clock signal through a circuit that is identical to the output interface circuit 146B (shown in FIG. 1B). In other embodiments, this delay EO2 is added by one or more buffers designed to replicate the delay of output interface circuit 146B. In the embodiment of FIG. 2D, inter-chip section 118 then adds a delay of BO to the first clock signal by sending it through an inter-chip delay path 152 (shown in FIG. 1B). I/O section 132 then adds a delay of EO1 by sending the first clock signal through a circuit that is identical to the input interface circuit 144B (shown in FIG. 1B). In other embodiments, this delay EO1 is added by one or more buffers designed to replicate the delay of input interface circuit 144B.

Figure 2E:
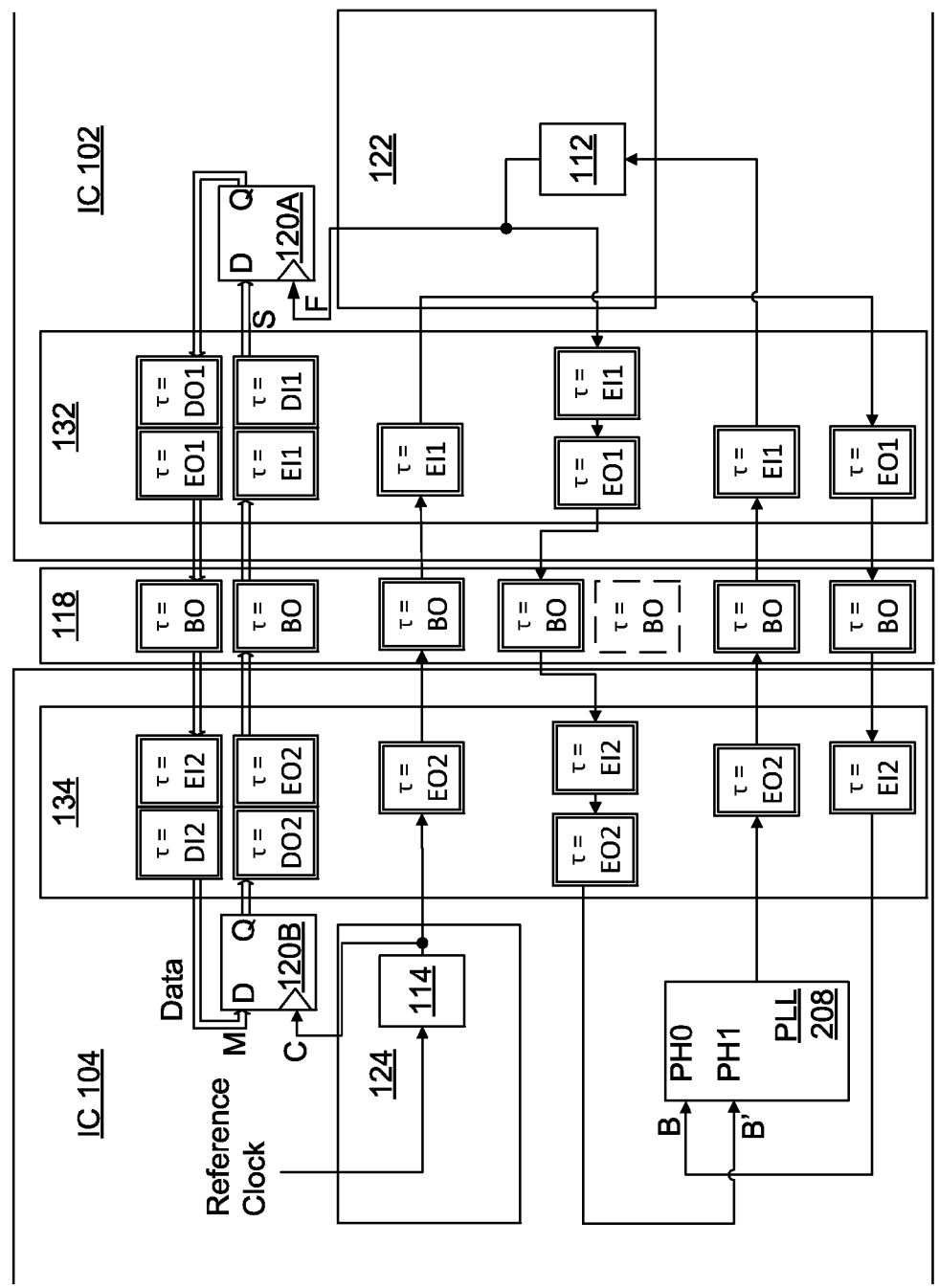
FIG. 2E shows a block diagram of a two IC system in which the only PLL is provided a reference clock signal, in accordance with embodiments of the present invention.

Referring now to FIG. 2E, an embodiment two IC system is shown that is identical to the embodiment of FIG. 2A, except that a reference clock signal is provided to the Clock Generator 124 of IC 104 (now shown on the left), the clock root signal output from PLL 208 is provided to the Clock Generator 122 of IC 102 (now shown on the right), and the phase inputs of PLL 208 are swapped, with the PH0 phase input receiving the output of the looping clock transfer path and the PH1 phase input receiving the output of the clock transfer path between Clock Generator 122 and Clock Synchronizer 125. The clock root signal output of PLL 208 is delayed by I/O section 134, inter-chip section 118, and I/O section 132 before reaching the clock tree 112 of Clock Generator 122 of IC 102. I/O section 134 adds to the clock root signal a delay of EO2 by sending the clock root signal through a circuit that is identical to the output interface circuit 146C (shown in FIG. 1B). In other embodiments, this delay is added by one or more buffers designed to replicate the delay of output interface circuit 146C. In the embodiment of FIG. 2E, inter-chip section 118 then adds a delay of BO to the first clock signal by sending it through an inter-chip delay path 152 (shown in FIG. 1B). I/O section 132 then adds a delay of EI1 by sending the first clock signal through a circuit that is identical to the input interface circuit 144C (shown in FIG. 1B). In other embodiments, this delay is added by one or more buffers designed to replicate the delay of input interface circuit 144C.

Figure 3A:
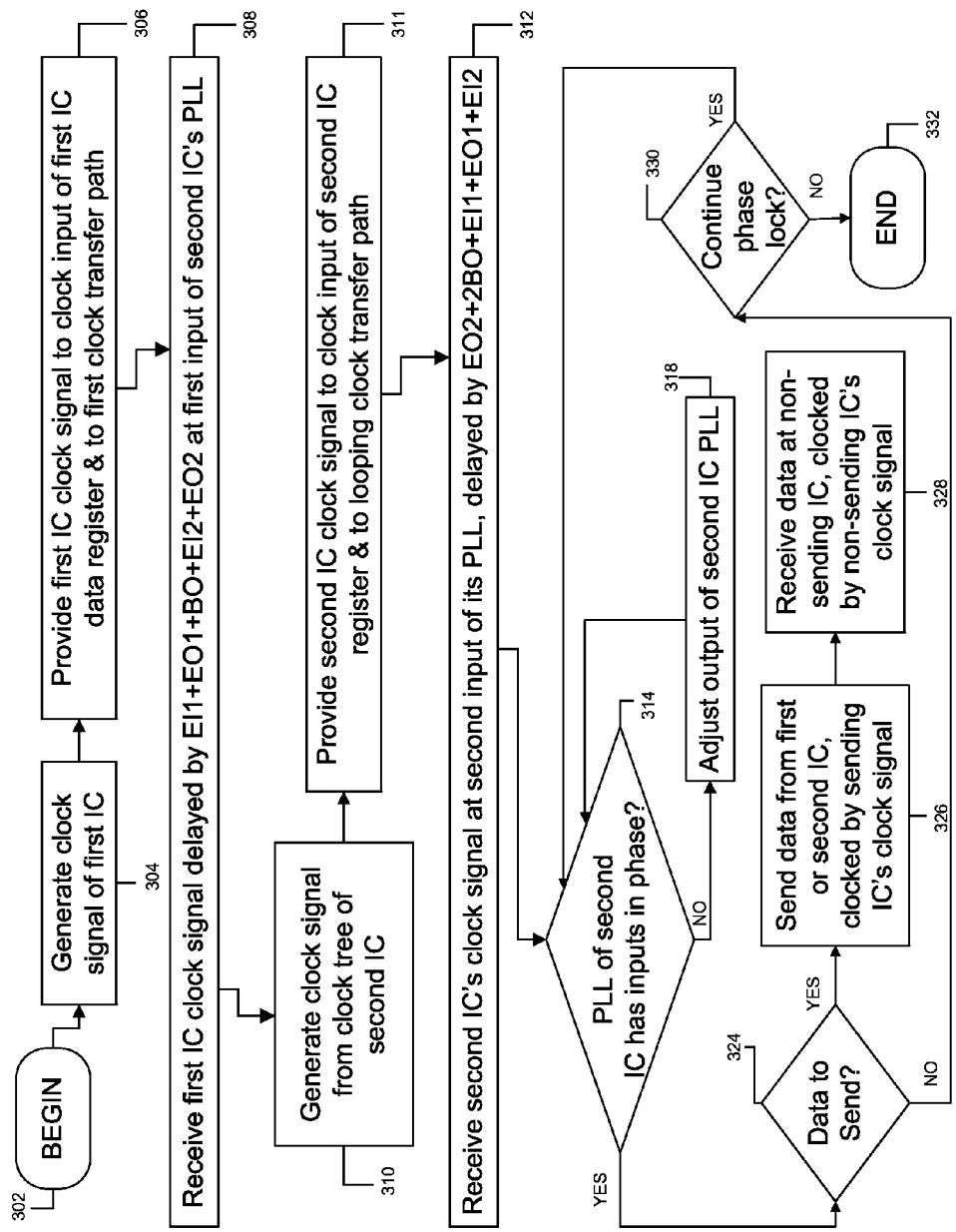
FIG. 3A shows a flow diagram of a method for synchronizing a two IC system in accordance with embodiments of the present invention.

FIG. 3A shows a flow diagram of an embodiment method for synchronizing a first IC and a second IC in a multi-IC system. The method begins at step 302. At step 304, a clock tree of a first IC generates a clock signal. In some embodiments, the first IC's clock tree receives a reference clock signal directly at its input. In other embodiments, the first IC's clock tree receives a clock root signal output from a PLL after the clock root signal has been delayed by passing between the two ICs. In still other embodiments, the first IC has a PLL that controls its clock tree, and this PLL has one phase input that receives the reference clock signal and another phase input that receives first IC's clock signal, either directly from the clock tree or after the clock signal has been delayed by passing between the two ICs. At step 306, the first IC's clock signal is provided to a data register of the first IC and also to a first clock transfer path between the first IC and the second IC. At step 308, the first IC's clock signal is received from the first clock transfer path at a first input of the second IC's PLL after being delayed by a delay of EI1+EO1+BO+EI2+EO2. At step 310, a clock tree of the second IC generates a clock signal. In some embodiments, the second IC's clock signal is generated based on the second IC's PLL output. In other embodiments, the second IC's clock signal is generated based on a reference clock signal. At step 311, this clock signal of the second IC is provided to a clock input of a data register of the second IC. The second IC's clock signal is also provided to a looping clock transfer path coupled to its PLL. At step 312, the second IC's clock signal is received from the looping clock transfer path at a second input of the second IC's PLL after being delayed in the looping clock transfer path by a delay of EO2+2BO+EI1+EO1+EI2. At step 314, a flow decision is made based on whether the first and second inputs of the second IC's PLL are in phase with each other. If these PLL inputs are not in phase, flow continues at step 318, and otherwise flow continues at step 324. At step 318, the output of the second IC's PLL is either advanced or delayed until its two inputs are in phase.

At step 324, a flow decision is then made based on whether there is data to be sent from either the first IC or the second IC. If so, flow continues at step 326, but if there is no data to send, the flow continues at step 330. At step 326, a data bit is sent by one of the first IC's data register (clocked by the first IC clock signal) or the second IC's data register (clocked by the second IC clock signal). Then at step 328, the data bit that was sent is received at the data register of whichever of the second or first IC did not send the data bit, and is clocked in to the data register of the receiving IC in accordance with the receiving IC's clock signal. If there is no data to send, at step 330 a flow decision is made on whether to continue operating in phase lock. Because achieving phase lock may incur a time penalty, in some embodiments phase lock occurs during IC start-up and is maintained until at least one of the two ICs is switched off. In such embodiments, the decision to continue phase lock at step 330 may be a decision to continue operating without switching off either one of the ICs. If phase lock is to be continued, flow returns to step 314. Otherwise, the method ends at step 332.

Figure 3B:
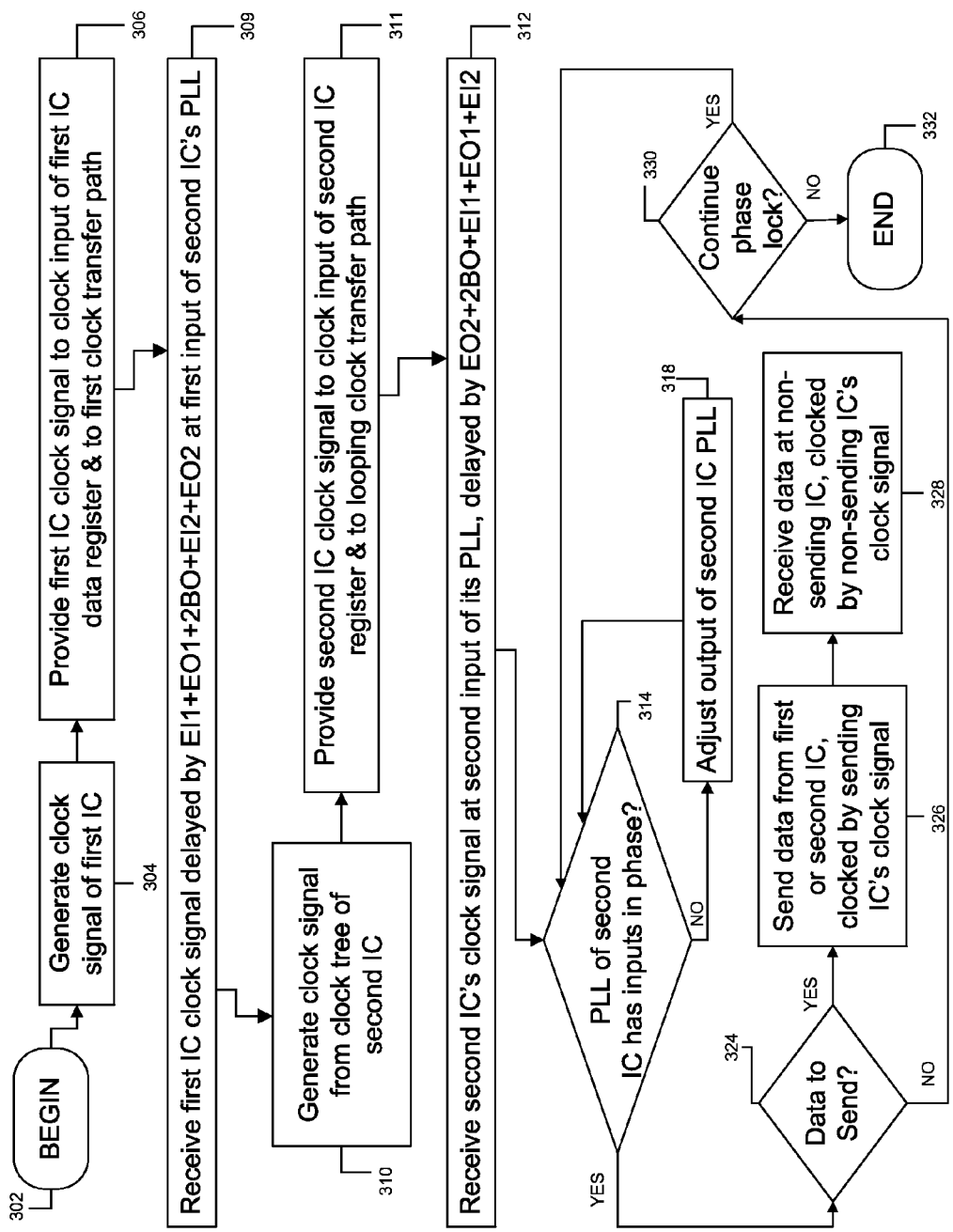
FIG. 3B shows a flow diagram of an alternative method to further reduce the register timing difference of the two IC system in accordance with embodiments of the present invention.

FIG. 3B shows a flow diagram of an alternative embodiment method for synchronizing a first IC and a second IC in a multi-IC system. The method of FIG. 3B is identical to the method of FIG. 3A, except that step 308 has been replaced by step 309. At step 309, the delay of the clock signal received from the first IC at the first input of the second IC's PLL has been increased by an amount BO relative to step 308 of FIG. 3A.

Illustrative embodiments of the present invention have the advantage of reducing clock skew and period difference between multiple ICs having independently balanced clock trees. An embodiment system may use, for example, synchronous interfacing between multiple ICs to reduce latency and increase system throughput.

In an embodiment, a method for integrated circuit (IC) clock distribution includes receiving a clock signal from a first IC over a first clock transfer path. The first clock transfer path includes a replica delay of a portion of a second clock transfer path. The method also includes generating, by a second IC, a clock signal of the second IC, transmitting the second IC clock signal over the second clock transfer path, receiving the second IC clock signal from the second clock transfer path, and determining, by the second IC, a clock root signal in accordance with the received first IC clock signal and the received second IC clock signal. In some embodiments, the second clock transfer path includes a first signal path and a second signal path; the delay of the first clock transfer path includes a replica delay of a portion of the first signal path and a replica delay of a portion of the second signal path; the first signal path includes an input interface circuit of the second IC; and the second signal path includes an output interface circuit of the second IC.

In some embodiments, the method for IC clock distribution includes transmitting, over a first data path, in accordance with a second IC data clocking period between two edges of the second IC clock signal, an output signal of a data register of the second IC. Such embodiments also include receiving, from a second data path, at a receive clocking time of the second IC in accordance with the second IC data clocking period, an input signal of the second IC data register. The second IC receive clocking time is not earlier than a data arrival time of the second IC, which is an arrival time at the second IC data register of a data unit from the second data path.

In some embodiments, the method for IC clock distribution includes generating, by the first IC, a first IC clock signal. Such embodiments also include: transmitting, over the second data path, in accordance with a first IC data clocking period between two edges of the first IC clock signal, an output signal of a data register of the first IC; receiving, from the first data path, at a receive clocking time of the first IC in accordance with the first IC clock signal, an input signal of the first IC data register; and transmitting the first IC clock signal over the first clock transfer path. The first IC receive clocking time is not earlier than a data arrival time of the first IC, which is an arrival time at the first IC data register of a data unit from the first data path. The second clock transfer path further includes a third signal path, a fourth signal path, a first inter-chip delay path, and a second inter-chip delay path. The delay of the first clock transfer path further includes a replica delay of a portion of the third signal path, delay of a third inter-chip delay path, and a replica delay of a portion of the fourth signal path. The third signal path includes an input interface circuit of the first IC, and the fourth signal path includes an output interface circuit of the first IC. In some embodiments of the method for IC clock distribution, the first clock transfer path further includes a fourth inter-chip delay path.

In some embodiments of the method for IC clock distribution, the input interface circuit of the first IC includes at least one of an input pad, a voltage level shifting circuit, a current level shifting circuit, a signal buffer, and an electrostatic discharge protection circuit. In such embodiments, the output interface circuit of the first IC includes at least one of an output pad, a voltage level shifting circuit, a current level shifting circuit, a signal buffer, and an electrostatic discharge protection circuit. In such embodiments, the input interface circuit of the second IC includes at least one of an input pad, a voltage level shifting circuit, a current level shifting circuit, a signal buffer, and an electrostatic discharge protection circuit. In such embodiments, the output interface circuit of the second IC includes at least one of an output pad, a voltage level shifting circuit, a current level shifting circuit, a signal buffer, and an electrostatic discharge protection circuit.

In some embodiments of the method for IC clock distribution, the generating the first IC clock signal is in accordance with a reference clock signal that includes an output signal of a reference oscillator, and the generating the second IC clock signal is in accordance with the clock root signal. In other embodiments, the generating the first IC clock signal is in accordance with the clock root signal, and the generating the second IC clock signal is in accordance with a reference clock signal that includes an output signal of a reference oscillator.

In some embodiments, the method for IC clock distribution includes adjusting, by the second IC, at least one of a pair of received clock signals to reduce a difference between the pair of received clock signals, the difference including at least one of a timing skew and a difference in data clocking period. The pair of received clock signals includes the received first IC clock signal from the first clock transfer path and the received second IC clock signal from the second clock transfer path. The first IC receive clocking time includes an aggregate of the first IC data arrival time and a receive data margin of the first IC. The second IC receive clocking time includes an aggregate of the second IC data arrival time and a receive data margin of the second IC. An unreduced timing skew between the pair of received clock signals is included in one of the first IC receive data margin and the second IC receive data margin.

In an embodiment, an IC clock distribution circuit is configured to receive a clock signal from a first IC over a first clock transfer path. The first clock transfer path includes a replica delay of a portion of a second clock transfer path. The circuit is also configured to generate, by a second IC, a clock signal of the second IC, transmit the second IC clock signal over the second clock transfer path, receive the second IC clock signal from the second clock transfer path, and determine, by the second IC, a clock root signal in accordance with the received first IC clock signal and the received second IC clock signal. In some embodiments, the second clock transfer path includes a first signal path and a second signal path; the delay of the first clock transfer path includes a replica delay of a portion of the first signal path and a replica delay of a portion of the second signal path; the first signal path includes an input interface circuit of the second IC; and the second signal path includes an output interface circuit of the second IC.

In some embodiments, the IC clock distribution circuit is configured to transmit, over a first data path, in accordance with a second IC data clocking period between two edges of the second IC clock signal, an output signal of a data register of the second IC. Such embodiments also are configured to receive, from a second data path, at a receive clocking time of the second IC in accordance with the second IC data clocking period, an input signal of the second IC data register. The second IC receive clocking time is not earlier than a data arrival time of the second IC, which is an arrival time at the second IC data register of a data unit from the second data path.

In some embodiments, the IC clock distribution circuit further includes a first IC. In such embodiments, the IC clock distribution circuit is further configured to generate, by the first IC, a first IC clock signal. In such embodiments, the IC clock distribution circuit is also configured to: transmit, over the second data path, in accordance with a first IC data clocking period between two edges of the first IC clock signal, an output signal of a data register of the first IC; receive, from the first data path, at a receive clocking time of the first IC in accordance with the first IC clock signal, an input signal of the first IC data register; and transmit the first IC clock signal over the first clock transfer path. The first IC receive clocking time is not earlier than a data arrival time of the first IC, which is an arrival time at the first IC data register of a data unit from the first data path. The second clock transfer path further includes a third signal path, a fourth signal path, a first inter-chip delay path, and a second inter-chip delay path. The delay of the first clock transfer path further includes a replica delay of a portion of the third signal path, delay of a third inter-chip delay path, and a replica delay of a portion of the fourth signal path. The third signal path includes an input interface circuit of the first IC, and the fourth signal path includes an output interface circuit of the first IC. In some embodiments of the IC clock distribution circuit, the first clock transfer path further includes a fourth inter-chip delay path.

In some embodiments of the IC clock distribution circuit, the input interface circuit of the first IC includes at least one of an input pad, a voltage level shifting circuit, a current level shifting circuit, a signal buffer, and an electrostatic discharge protection circuit. In such embodiments, the output interface circuit of the first IC includes at least one of an output pad, a voltage level shifting circuit, a current level shifting circuit, a signal buffer, and an electrostatic discharge protection circuit. In such embodiments, the input interface circuit of the second IC includes at least one of an input pad, a voltage level shifting circuit, a current level shifting circuit, a signal buffer, and an electrostatic discharge protection circuit. In such embodiments, the output interface circuit of the second IC includes at least one of an output pad, a voltage level shifting circuit, a current level shifting circuit, a signal buffer, and an electrostatic discharge protection circuit.

In some embodiments, the IC clock distribution circuit is configured to: generate the first IC clock signal in accordance with a reference clock signal that includes an output signal of a reference oscillator; and generate the second IC clock signal in accordance with the clock root signal. In other embodiments, the IC clock distribution circuit is configured to: generate the first IC clock signal in accordance with the clock root signal; and generate the second IC clock signal in accordance with a reference clock signal that includes an output signal of a reference oscillator.

In some embodiments, the IC clock distribution circuit is configured to adjust, by the second IC, at least one of a pair of received clock signals to reduce a difference between the pair of received clock signals, the difference including at least one of a timing skew and a difference in data clocking period. The pair of received clock signals includes the received first IC clock signal from the first clock transfer path and the received second IC clock signal from the second clock transfer path. The first IC receive clocking time includes an aggregate of the first IC data arrival time and a receive data margin of the first IC. The second IC receive clocking time includes an aggregate of the second IC data arrival time and a receive data margin of the second IC. An unreduced timing skew between the pair of received clock signals is included in one of the first IC receive data margin and the second IC receive data margin.

In an embodiment, an IC clock distributor system includes a first IC. The first IC includes a clock synchronizer circuit and a clock generator circuit. The clock synchronizer circuit includes a first input coupled to a first clock transfer path including a replica delay of a portion of a first signal path included in an external IC. The clock synchronizer circuit also includes a second input coupled to a second clock transfer path. The clock generator circuit also includes an input coupled to an output of at least one of a reference oscillator and the clock synchronizer circuit. Delay of the second clock transfer path includes delay of the first signal path. In some embodiments, the clock synchronizer circuit further includes at least one of a phase lock loop and a digital lock loop, and the first IC further includes an input interface circuit and an output interface circuit. In such embodiments, delay of the first clock transfer path further includes a replica delay of a portion of a second signal path and a replica delay of a portion of a third signal path; the second clock transfer path includes the second signal path and the third signal path; the second signal path includes the input interface circuit of the first IC; and the third signal path includes the output interface circuit of the first IC.

In some embodiments of the IC clock distributor system, the first IC includes a data register. The data register of the first IC includes a clock input coupled to an output of the first IC clock generator circuit, an output coupled to a first data path, and an input signal coupled to a second data path.

In some embodiments, the IC clock distributor system includes a second IC, which is the external IC. The second IC includes a clock generation circuit, a data register, an input interface circuit, and an output interface circuit. The data register of the second IC includes a clock input coupled to an output of the first IC clock generation circuit, an output coupled to the second data path, and a data input coupled to the first data path. The second IC clock generation circuit includes an output coupled to an input of the first clock transfer path. The delay of the first clock transfer path further includes delay of a first inter-chip delay path and a replica delay of a portion of a fourth signal path. The second clock transfer path further includes the first signal path, a second inter-chip delay path, a third inter-chip delay path, and the fourth signal path. The first signal path includes the output interface circuit of the second IC, and the fourth signal path includes the input interface circuit of the second IC. In some embodiments of the IC clock distributor system, the first clock transfer path further includes a replica delay of a portion of the third inter-chip delay path.

In some embodiments of the IC clock distributor system, the input interface circuit of the first IC includes at least one of an input pad, a voltage level shifting circuit, a current level shifting circuit, a signal buffer, and an electrostatic discharge protection circuit. In such embodiments, the output interface circuit of the first IC includes at least one of an output pad, a voltage level shifting circuit, a current level shifting circuit, a signal buffer, and an electrostatic discharge protection circuit. In such embodiments, the input interface circuit of the second IC includes at least one of an input pad, a voltage level shifting circuit, a current level shifting circuit, a signal buffer, and an electrostatic discharge protection circuit. In such embodiments, the output interface circuit of the second IC includes at least one of an output pad, a voltage level shifting circuit, a current level shifting circuit, a signal buffer, and an electrostatic discharge protection circuit.

In some embodiments of the IC clock distributor system, the delay of the first data path includes a replica delay of a portion of the third signal path, a replica delay of a portion of the fourth signal path, and delay of a fourth inter-chip delay path. In such embodiments, the delay of the second data path includes a replica delay of a portion of the first signal path, a replica delay of a portion of the second signal path, and delay of a fifth inter-chip delay path.

In some embodiments, the IC clock distributor system includes a second IC, which is the external IC, the first IC clock generator circuit includes an input coupled to an output of a reference oscillator, and the second IC includes a clock generator circuit that includes an input coupled to an output of the clock synchronizer circuit. In other embodiments where the IC clock distributor system includes a second IC that is an external IC, the first IC clock generator circuit includes an input coupled to an output of the clock synchronizer circuit, and the second IC includes a clock generator circuit that includes an input coupled to an output of a reference oscillator.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for integrated circuit (IC) clock distribution, the method comprising:
   receiving a clock signal from a first IC over a first clock transfer path, the first clock transfer path comprising a replica delay of a portion of a second clock transfer path;
   generating, by a second IC, a clock signal of the second IC;
   transmitting the second IC clock signal over the second clock transfer path;
   receiving the second IC clock signal from the second clock transfer path; and
   determining, by the second IC, a clock root signal in accordance with the received first IC clock signal and the received second IC clock signal.

2. The method of claim 1, wherein:
   the second clock transfer path comprises a first signal path and a second signal path;
   delay of the first clock transfer path comprises a replica delay of a portion of the first signal path and a replica delay of a portion of the second signal path;
   the first signal path comprises an input interface circuit of the second IC; and
   the second signal path comprises an output interface circuit of the second IC.

3. The method of claim 2, further comprising:
transmitting, over a first data path, in accordance with a second IC data clocking period between two edges of the second IC clock signal, an output signal of a data register of the second IC; and
receiving, from a second data path, at a receive clocking time of the second IC in accordance with the second IC data clocking period, an input signal of the second IC data register, wherein
the second IC receive clocking time is not earlier than a data arrival time of the second IC, the second IC data arrival time comprising an arrival time at the second IC data register of a data unit from the second data path.

4. The method of claim 3, further comprising:
generating, by the first IC, a first IC clock signal;
transmitting, over the second data path, in accordance with a first IC data clocking period between two edges of the first IC clock signal, an output signal of a data register of the first IC;
receiving, from the first data path, at a receive clocking time of the first IC in accordance with the first IC clock signal, an input signal of the first IC data register; and
transmitting the first IC clock signal over the first clock transfer path, wherein
the first IC receive clocking time is not earlier than a data arrival time of the first IC, the first IC data arrival time comprising an arrival time at the first IC data register of a data unit from the first data path,
the second clock transfer path further comprises a third signal path, a fourth signal path, a first inter-chip delay path, and a second inter-chip delay path,
the delay of the first clock transfer path further comprises a replica delay of a portion of the third signal path, delay of a third inter-chip delay path, and a replica delay of a portion of the fourth signal path,
the third signal path comprises an input interface circuit of the first IC, and
the fourth signal path comprises an output interface circuit of the first IC.

5. The method of claim 4, wherein the first clock transfer path further comprises a fourth inter-chip delay path.

6. The method of claim 4, wherein:
the input interface circuit of the first IC comprises at least one of an input pad, a voltage level shifting circuit, a current level shifting circuit, a signal buffer, and an electrostatic discharge protection circuit;
the output interface circuit of the first IC comprises at least one of an output pad, a voltage level shifting circuit, a current level shifting circuit, a signal buffer, and an electrostatic discharge protection circuit;
the input interface circuit of the second IC comprises at least one of an input pad, a voltage level shifting circuit, a current level shifting circuit, a signal buffer, and an electrostatic discharge protection circuit; and
the output interface circuit of the second IC comprises at least one of an output pad, a voltage level shifting circuit, a current level shifting circuit, a signal buffer, and an electrostatic discharge protection circuit.

7. The method of claim 6, wherein:
the generating the first IC clock signal is in accordance with a reference clock signal comprising an output signal of a reference oscillator; and
the generating the second IC clock signal is in accordance with the clock root signal.

8. The method of claim 6, wherein:
the generating the first IC clock signal is in accordance with the clock root signal; and
the generating the second IC clock signal is in accordance with a reference clock signal comprising an output signal of a reference oscillator.

9. The method of claim 6, further comprising:
adjusting, by the second IC, at least one of a pair of received clock signals to reduce a difference between the pair of received clock signals, the difference comprising at least one of a timing skew and a difference in data clocking period, wherein
the pair of received clock signals comprises the received first IC clock signal from the first clock transfer path and the received second IC clock signal from the second clock transfer path,
the first IC receive clocking time comprises an aggregate of the first IC data arrival time and a receive data margin of the first IC,
the second IC receive clocking time comprises an aggregate of the second IC data arrival time and a receive data margin of the second IC, and
an unreduced timing skew between the pair of received clock signals is comprised in one of the first IC receive data margin and the second IC receive data margin.

10. An integrated circuit (IC) clock distribution circuit configured to:
receive a clock signal from a first IC over a first clock transfer path, the first clock transfer path comprising a replica delay of a portion of a second clock transfer path;
generate, by a second IC, a clock signal of a second IC, wherein the IC clock distribution circuit comprises the second IC;
transmit the second IC clock signal over the second clock transfer path;
receive a second IC clock signal from the second clock transfer path; and
determine, by the second IC, a clock root signal in accordance with the received first IC clock signal and the received second IC clock signal.

11. The circuit of claim 10, wherein:
the second clock transfer path comprises a first signal path and a second signal path;
delay of the first clock transfer path comprises a replica delay of a portion of the first signal path and a replica delay of a portion of the second signal path;
the first signal path comprises an input interface circuit of the second IC; and
the second signal path comprises an output interface circuit of the second IC.

12. The circuit of claim 11, further configured to:
transmit, over a first data path, in accordance with a second IC data clocking period between two edges of the second IC clock signal, an output signal of a data register of the second IC; and
receive, from a second data path, at a receive clocking time of the second IC in accordance with the second IC data clocking period, an input signal of the second IC data register, wherein
the second IC receive clocking time is not earlier than a data arrival time of the second IC, the second IC data arrival time comprising an arrival time at the second IC data register of a data unit from the second data path.

13. The circuit of claim 12, further comprising a first IC, wherein:
the circuit is further configured to
generate, by the first IC, a first IC clock signal,
transmit, over the second data path, in accordance with a first IC data clocking period between two edges of the first IC clock signal, an output signal of a data register of the first IC,
receive, from the first data path, at a receive clocking time of the first IC in accordance with the first IC clock signal, an input signal of the first IC data register, and
transmit the first IC clock signal over the first clock transfer path;
the first IC receive clocking time is not earlier than a data arrival time of the first IC, the first IC data arrival time comprising an arrival time at the first IC data register of a data unit from the first data path;
the second clock transfer path further comprises a third signal path, a fourth signal path, a first inter-chip delay path, and a second inter-chip delay path;
the delay of the first clock transfer path further comprises a replica delay of a portion of the third signal path, delay of a third inter-chip delay path, and a replica delay of a portion of the fourth signal path;
the third signal path comprises an input interface circuit of the first IC; and
the fourth signal path comprises an output interface circuit of the first IC.

14. The circuit of claim 13, wherein the first clock transfer path further comprises a fourth inter-chip delay path.

15. The circuit of claim 13, wherein:
the input interface circuit of the first IC comprises at least one of an input pad, a voltage level shifting circuit, a current level shifting circuit, a signal buffer, and an electrostatic discharge protection circuit;
the output interface circuit of the first IC comprises at least one of an output pad, a voltage level shifting circuit, a current level shifting circuit, a signal buffer, and an electrostatic discharge protection circuit;
the input interface circuit of the second IC comprises at least one of an input pad, a voltage level shifting circuit, a current level shifting circuit, a signal buffer, and an electrostatic discharge protection circuit; and
the output interface circuit of the second IC comprises at least one of an output pad, a voltage level shifting circuit, a current level shifting circuit, a signal buffer, and an electrostatic discharge protection circuit.

16. The circuit of claim 15, further configured to:
generate the first IC clock signal in accordance with a reference clock signal comprising an output signal of a reference oscillator; and
generate the second IC clock signal in accordance with the clock root signal.

17. The circuit of claim 15, further configured to:
generate the first IC clock signal in accordance with the clock root signal; and
generate the second IC clock signal in accordance with a reference clock signal comprising an output signal of a reference oscillator.

18. The circuit of claim 15, further configured to:
adjust, by the second IC, at least one of a pair of received clock signals to reduce a difference between the pair of received clock signals, the difference comprising at least one of a timing skew and a difference in data clocking period, wherein the pair of received clock signals comprises the received first IC clock signal from the first clock transfer path and the received second IC clock signal from the second clock transfer path,
the first IC receive clocking time comprises an aggregate of the first IC data arrival time and a receive data margin of the first IC,
the second IC receive clocking time comprises an aggregate of the second IC data arrival time and a receive data margin of the second IC, and
an unreduced timing skew between the pair of received clock signals is comprised in one of the first IC receive data margin and the second IC receive data margin.

19. An integrated circuit (IC) clock distributor system comprising a first IC, wherein:
the first IC comprises a clock synchronizer circuit and a clock generator circuit;
the clock synchronizer circuit comprises
a first input coupled to a first clock transfer path comprising a replica delay of a portion of a first signal path comprised in an external IC, and
a second input coupled to a second clock transfer path; and
the clock generator circuit comprises an input coupled to an output of at least one of a reference oscillator and the clock synchronizer circuit, wherein delay of the second clock transfer path comprises delay of the first signal path.

20. The system of claim 19, wherein:
the clock synchronizer circuit further comprises at least one of a phase lock loop and a digital lock loop;
the first IC further comprises an input interface circuit and an output interface circuit;
delay of the first clock transfer path further comprises a replica delay of a portion of a second signal path and a replica delay of a portion of a third signal path;
the second clock transfer path comprises the second signal path and the third signal path;
the second signal path comprises the input interface circuit of the first IC; and
the third signal path comprises the output interface circuit of the first IC.

21. The system of claim 20, wherein:
the first IC further comprises a data register; and
the data register of the first IC comprises:
a clock input coupled to an output of the first IC clock generator circuit;
an output coupled to a first data path; and
an input signal coupled to a second data path.

22. The system of claim 21, further comprising a second IC, wherein:
the second IC comprises the external IC;
the second IC comprises a clock generation circuit, a data register, an input interface circuit, and an output interface circuit;
the data register of the second IC comprises
a clock input coupled to an output of the first IC clock generation circuit,
an output coupled to the second data path, and
a data input coupled to the first data path;
the second IC clock generation circuit comprises an output coupled to an input of the first clock transfer path;
the delay of the first clock transfer path further comprises delay of a first inter-chip delay path and a replica delay of a portion of a fourth signal path;

the second clock transfer path further comprises the first signal path, a second inter-chip delay path, a third inter-chip delay path, and the fourth signal path;

the first signal path comprises the output interface circuit of the second IC; and the fourth signal path comprises the input interface circuit of the second IC.

23. The system of claim 22, wherein the first clock transfer path further comprises a replica delay of a portion of the third inter-chip delay path.

24. The system of claim 22, wherein:

the input interface circuit of the first IC comprises at least one of an input pad, a voltage level shifting circuit, a current level shifting circuit, a signal buffer, and an electrostatic discharge protection circuit;

the output interface circuit of the first IC comprises at least one of an output pad, a voltage level shifting circuit, a current level shifting circuit, a signal buffer, and an electrostatic discharge protection circuit;

the input interface circuit of the second IC comprises at least one of an input pad, a voltage level shifting circuit, a current level shifting circuit, a signal buffer, and an electrostatic discharge protection circuit; and the output interface circuit of the second IC comprises at least one of an output pad, a voltage level shifting circuit, a current level shifting circuit, a signal buffer, and an electrostatic discharge protection circuit.

25. The system of claim 22, wherein:

the delay of the first data path comprises a replica delay of a portion of the third signal path, a replica delay of a portion of the fourth signal path, and delay of a fourth inter-chip delay path; and the delay of the second data path comprises a replica delay of a portion of the first signal path, a replica delay of a portion of the second signal path, and delay of a fifth inter-chip delay path.

26. The system of claim 19, further comprising a second IC, wherein:

the second IC comprises the external IC;

the first IC clock generator circuit comprises an input coupled to an output of a reference oscillator; and the second IC comprises a clock generator circuit comprising an input coupled to an output of the clock synchronizer circuit.

27. The system of claim 19, further comprising a second IC, wherein:

the second IC comprises the external IC;

the first IC clock generator circuit comprises an input coupled to an output of the clock synchronizer circuit; and the second IC comprises a clock generator circuit comprising an input coupled to an output of a reference oscillator.

* * * * *